United States Patent
Sheu et al.

(10) Patent No.: US 6,694,208 B1
(45) Date of Patent: Feb. 17, 2004

(54) METHOD FOR PRIORITIZING FAILURE MODES TO IMPROVE YIELD RATE IN MANUFACTURING SEMICONDUCTOR DEVICES

(75) Inventors: Shiow-Hwan Sheu, Hsinchu (TW); Chia-Yen Cha, Hsinchu (TW)

(73) Assignees: ProMos Technologies, Inc., Hsinchu (TW); Mosel Vitelic Inc., Hsinchu (TW); Siemens A.G., Muchen (DE)

( * ) Notice: Subject to any disclaimer, the term of this patent is extended or adjusted under 35 U.S.C. 154(b) by 0 days.

(21) Appl. No.: 09/570,994

(22) Filed: May 15, 2000

(51) Int. Cl.$^7$ ............................................. G06F 19/00
(52) U.S. Cl. .................... 700/121; 700/110; 714/742; 702/81
(58) Field of Search ................ 700/108–110, 121; 714/703, 704, 715, 718, 722–725, 742, 745; 702/35, 81–84, 117; 438/10–18; 324/765; 716/4–6

(56) References Cited

U.S. PATENT DOCUMENTS

| | | | | |
|---|---|---|---|---|
| 5,598,341 A | * | 1/1997 | Ling et al. .................. 700/110 |
| 5,991,699 A | * | 11/1999 | Kulkarni et al. .............. 702/83 |
| 6,017,771 A | * | 1/2000 | Yang et al. .................... 438/7 |
| 6,367,040 B1 | * | 4/2002 | Ott et al. ..................... 714/724 |
| 6,374,199 B1 | * | 4/2002 | Sugimoto .................... 703/2 |
| 6,389,323 B1 | * | 5/2002 | Yang et al. ................ 700/110 |
| 6,393,602 B1 | * | 5/2002 | Atchison et al. ............... 716/4 |
| 6,493,645 B1 | * | 12/2002 | Hladschik ................... 702/81 |
| 6,507,800 B1 | * | 1/2003 | Sheu .......................... 702/117 |
| 6,539,272 B1 | * | 3/2003 | Ono et al. .................. 700/110 |
| 6,553,521 B1 | * | 4/2003 | Rathei et al. ............... 714/722 |

* cited by examiner

Primary Examiner—Maria N. Von Buhr
(74) Attorney, Agent, or Firm—Blakely, Sokoloff, Taylor & Zafman, LLP

(57) ABSTRACT

A method for determining a failure mode with the greatest effect on yield loss in a semiconductor manufacturing process is disclosed. A predetermined number of wafers are processed, and each chip on each wafer is divided into a plurality of regions with each region having a plurality of cells. Electrical tests are performed on each cell, and a region is said to have a failure mode if one cell within the region has that failure mode. The yield loss contribution of a failure mode is determined by considering the yield loss from several wafers having that failure mode as the main failure mode. The yield loss contribution of a failure mode can also be determined by considering the percentage of defective chips on a wafer having that failure mode as the main failure mode. The failure mode with the highest yield loss contribution has the greatest effect on yield loss.

25 Claims, 2 Drawing Sheets

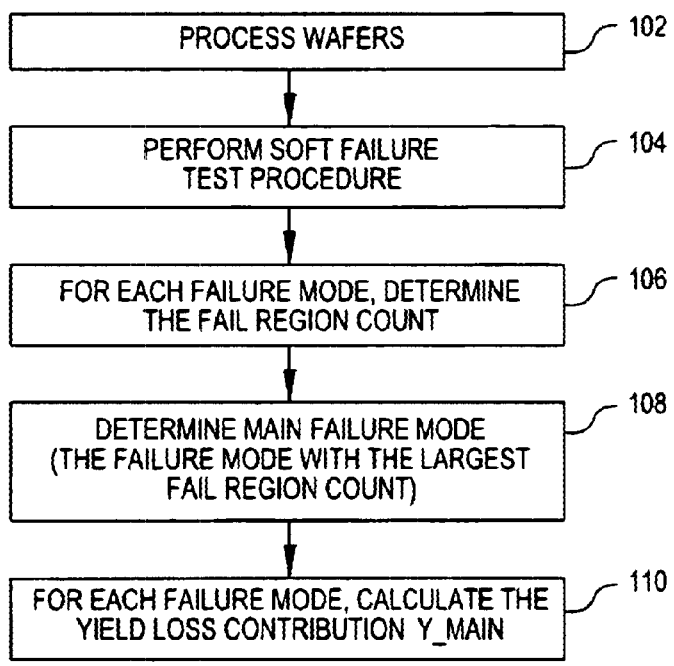
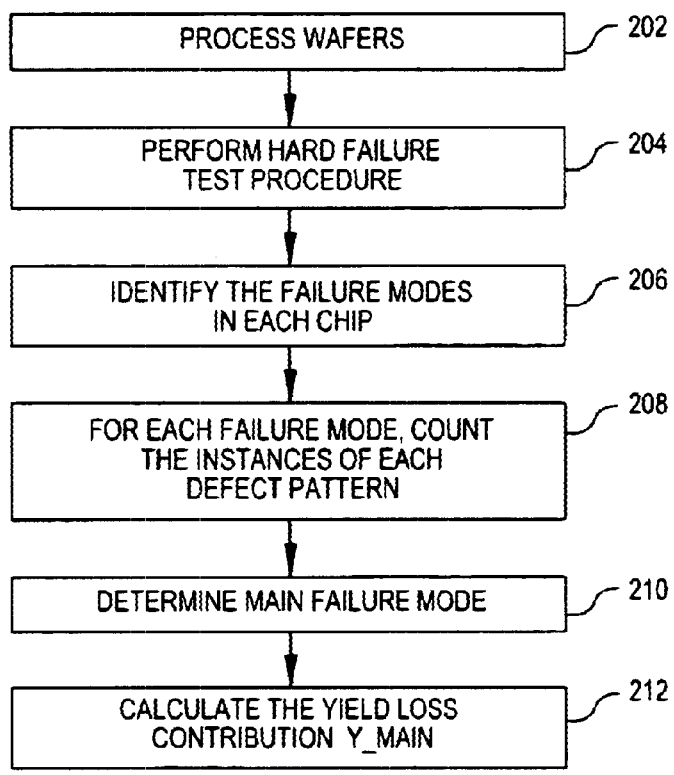

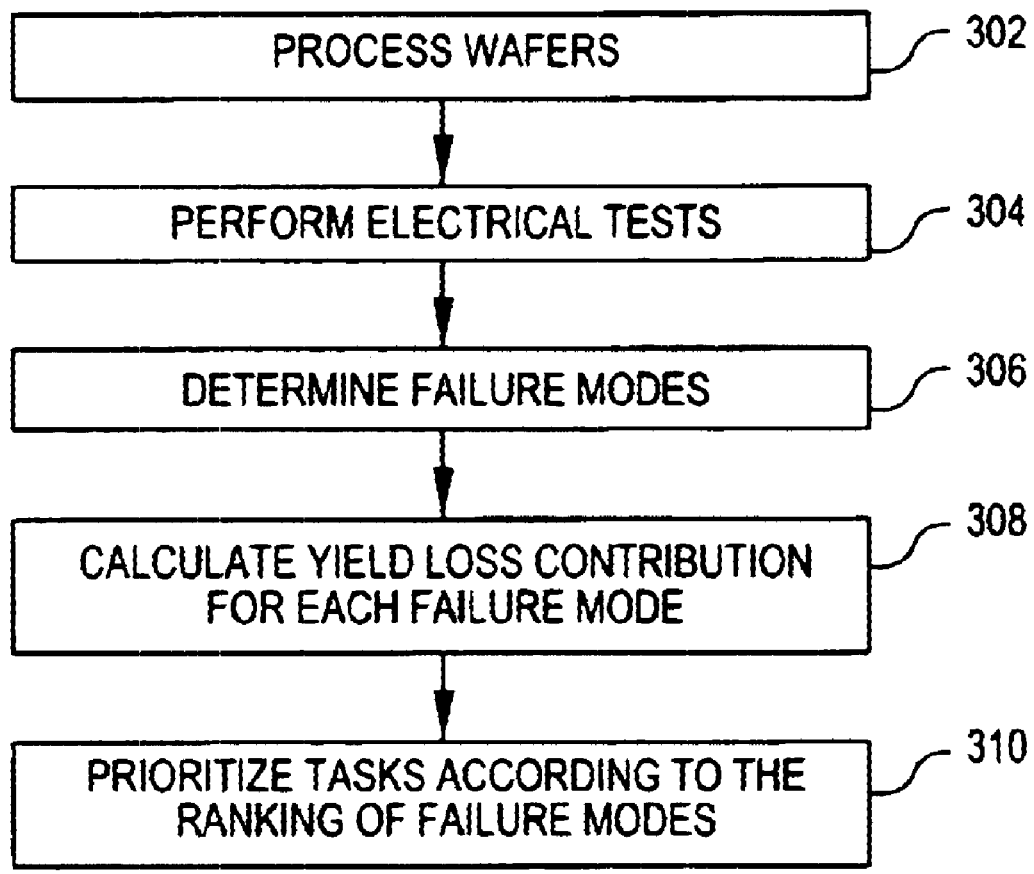

METHOD FOR PRIORITIZING FAILURE MODES TO IMPROVE YIELD RATE IN MANUFACTURING SEMICONDUCTOR DEVICES

FIELD OF THE INVENTION

This invention relates to a method of testing semiconductor devices, and more particularly, to an improved method of prioritizing failure modes to determine the cause of yield loss in a semiconductor manufacturing process.

BACKGROUND OF THE INVENTION

Semiconductor processing involves forming layers of materials on a semiconductor wafer and forming patterns on those layers to produce functional circuitry. A typical semiconductor wafer contains several dies (or chips) that are later packaged into individual integrated circuits. Errors may occur during the manufacturing process, rendering a percentage of the chips on a wafer to become defective. The yield rate is the percentage of chips that are functional relative to the total number of chips on a wafer. To improve yield rate, test structure, or test circuitry, is formed alongside the chips on the wafer to allow electrical tests to be conducted during and after the manufacturing process. Test signals are sent via probes into the test circuitry to measure certain parameters of a chip. These electrical tests may also measure parameters related to a group of chips that are adjacent to one another on the wafer. Usually when an equipment or process has errors, a number of parameters on a chip are affected. The characteristics of the chip as manifested by these parameters are called a "failure mode". Different failure modes are linked to different kinds of errors that may occur in equipments or processes. Thus, a test that measures the parameters related to a particular failure mode can be used to determine whether a certain equipment or process is functioning properly.

Initially, a set of tests is conducted on a series of wafers, and a human operator determines whether the chips on the wafers show a particular failure mode. Test data obtained from a wafer that is determined to have a particular failure mode is stored in a database as the standard test data. When a subsequent wafer is processed, the new test data from the subsequently processed wafer is compared against the standard test data to determine whether the new wafer has a particular failure mode. If a new wafer shows a particular failure mode, then adjustments are made to the equipment or process that is related to that particular failure mode.

Typically, hundreds of wafers are processed in a semiconductor plant each day, each wafer contains hundreds of chips, and numerous electrical tests are performed on each of these chips. Thus, an enormous amount of data is generated from these tests. The task of comparing the new test data with the standard test data has been difficult and time consuming. Often several failure modes are detected on a wafer, or different wafers manifest different failure modes. The seriousness of the errors in the equipment or process that caused each failure mode may be different. Thus, it is desirable to know which failure mode contributed the most to yield loss. Traditionally, it has been difficult to automatically determine which parameter is most closely linked to the yield loss without human judgement.

The present invention is directed to a method of automatically determining the relationship between a failure mode and the yield loss, allowing a user to prioritize the failure modes for adjusting equipment or process and thereby effectively reducing yield loss.

SUMMARY OF THE INVENTION

A method for determining a failure mode with the greatest effect on yield loss in a semiconductor manufacturing process is disclosed. A predetermined number of wafers are processed, and each chip on each wafer is divided into a plurality of regions with each region having a plurality of cells. Electrical tests are performed on each cell, and a region is said to have a failure mode if one cell within the region has that failure mode. The yield loss contribution of a failure mode is determined by considering the yield loss from several wafers having that failure mode as the main failure mode. The yield loss contribution of a failure mode can also be determined by considering the percentage of defective chips on a wafer having that failure mode as the main failure mode. The failure mode with the highest yield loss contribution will have the greatest effect on yield loss.

BRIEF DESCRIPTION OF DRAWINGS

The present invention will be described in conjunction with the following drawings, wherein:

FIG. 1 is a flow diagram of an embodiment of the invention.

FIG. 2 is a flow diagram of another embodiment of the invention.

FIG. 3 is a flow diagram of still another embodiment of the invention.

DETAILED DESCRIPTION OF THE INVENTION

A semiconductor production line typically has hundreds of equipment running hundreds of processing steps at the same time. When defects occur on wafers, they could be caused by errors in several processes and tools. To improve the yield rate in the shortest amount of time, the failure mode that contributed the greatest to yield loss is found. Adjustments to the processes or equipment related to that failure mode will thus result in the greatest improvement of yield rate.

FIG. 1 shows a flow diagram of an embodiment of the invention. In box 102, a wafer lot is processed and a plurality of chips are formed on each wafer. Each chip is divided into a plurality of regions, and each region includes a plurality of cells. As an example, the chips can be memory chips. Preferably, each wafer lot contains 25 wafers, each wafer contains 400 memory chips, each chip is a 64 megabit memory device, and the 64 M memory cells are grouped into 1024 regions. In box 104, a soft failure test procedure is performed. The soft failure test procedure comprises a set of tests conducted on each memory cell to determine whether the cell has certain failure modes. The soft failure test procedure includes a number of electrical tests that measure various parameters of the memory cell circuitry. The tests may be applied sequentially to each cell until a defective cell is found. If one cell within a region has a particular failure mode, then the whole region is marked as having that particular failure mode. The soft failure test procedure detects "soft defects" that may occur over time. For example, if a metal conductor is defective and is thinner than its normal width, the conductance of the conductor decreases and heating occurs. The conductor may conduct at first, and the chip may seem to function normally, but after a period of time, the metal conductor melts and the chip becomes defective. Typically, soft defects may be corrected by using laser to cure the defective spots.

In box 106, for each failure mode, the number of regions having that failure mode is counted. The number of regions having a particular failure mode is called the "fail region count". For each failure mode, there is a corresponding fail region count. In box 108, the failure mode with the largest fail region count is designated as the "main failure mode" for each wafer. The steps in box 104 to 108 are performed for each wafer. If all of the wafers have the same main failure mode, then there will only be one main failure mode. Typically, different wafers will have different main failure modes. In box 110, for each main failure mode, the yield loss contribution is calculated. Define "n" as the number of wafers that have a particular failure mode as the "main failure mode". Define $y_i$ (i=1 . . . n) as the yield loss for the ith wafer having the same failure mode. The yield loss $y_i$ is determined by dividing the number of defective chips by the total number of chips (400 in this example). A chip is deemed defective if it fails any of the tests in the soft failure test procedure. Define $Y_{main}$ as the yield loss contribution due to the main failure mode, then $Y_{main}$ is calculated as:

$$Y_{main} = n/N \times \text{average} (y_1 + y_2 + \ldots y_n) \quad \text{(Equ. 1)}$$

where N is total number of wafers (25 in this example).

After Equ. 1 is performed to each type of main failure mode, the yield loss contribution $Y_{main}$ for each main failure mode can be further used to improve yield rate of production line. For example, the main failure modes can be ranked according to the magnitude of the yield loss contribution ($Y_{main}$). The failure mode with the largest yield loss contribution has the greatest effect on yield loss. Thus by adjusting the equipment or process related to this failure mode, the yield rate is improved most effectively. As an example, if the main failure mode with the largest yield loss contribution is related to the etching process for one of the metal layers, then adjusting equipment or processes related to the metal layers may increase the yield rate most effectively.

Preferably, the soft failure test procedure may further comprise two subsets of tests. Each subset of tests may have a different testing duration period. The two subsets of tests may also be different, and contain tests for measure different characteristics or parameters of the chips. By using subsets of tests with different testing durations periods, cells having soft failures that may worsen over time may be detected with better accuracy. The first subset of tests with a shorter testing duration period are conducted on the cells. If a cell fails the first subset of tests and is not repairable, then it will not go through the second subset of tests with a longer testing duration period. For different types of chips, the length of testing periods for the two subsets of tests may be different.

FIG. 2 shows a flow diagram of another embodiment of the invention. In box 202, a wafer is processed, and a plurality of chips are formed on each wafer. Each chip is divided into a plurality of regions, and each region includes a plurality of cells. As an example, the chips may be memory chips. Preferably, each wafer contains 400 memory chips, each chip is a 64 megabit memory device, and the 64 M memory cells are grouped into 1024 regions. In box 204, the hard failure test procedure is applied to each memory cell to determine whether the cell has certain failure modes. The hard failure test procedure includes a number of electrical tests that measure various parameters of the memory cell circuitry. The hard failure test procedure tests for "hard defects" that are usually formed at the time the chip is made, unlike soft defects that occur over time. Typically, the hard failure test procedure tests the functionality of a cell. A cell is deemed defective if a functionality of the cell does not meet a certain standard. For example, the read/write functionality of a cell is tested by first performing a "write" operation to write a "1" data into a cell, then perform a "read" operation to determine if a "1" data can be read from that cell. If a "0" data is read from the cell, then that cell is defective. Preferably, a direct current test is also performed to determine whether there are any broken connection lines. When a cell within a region is found to be defective, the region is deemed to be defective. The defective regions are marked on a wafer map. In this example, the wafer map contains 400 chips, and each chip has 1024 regions.

In box 206, the failure modes in each chip of the wafer is identified. The failure modes may be identified by examining the distribution of the defective regions. Preferably, at least three types of defect patterns that correspond to three types of failure modes are examined. The first type of defect pattern is called the "single-bit defect pattern". A "single-bit defect pattern" occurs when a single region is defective, while its adjacent regions are all functional. The "single-bit defect pattern" corresponds to the "single-bit failure mode". The second type of defect pattern is called the "twin-bit defect pattern". The "twin-bit defect pattern" is found when two adjacent regions are defective, while the other regions surrounding and adjacent to these two defective regions are functional. The "twin-bit defect pattern" corresponds to the "twin-bit failure mode". The third type of defect pattern is called the "one-mega defect pattern". The "one-mega defect pattern" is found when four adjacent regions are defective, while the other regions surrounding and adjacent to these four defective regions are functional. The "one-mega defect pattern" corresponds to the "one-mega failure mode".

In box 208, for each type of failure mode, the number of instances of the corresponding defect pattern is counted. For example, if a chip has 3 instances in which two adjacent defective regions are surrounded by functional regions, then the chip is said to have 3 instances of "twin-bit defect pattern". Likewise, the number of instances for the "single-bit defect pattern" and the "one-mega defect pattern" are counted. The process of counting the number of instances of the defect patterns may be done automatically by a computer having a database containing the measurement data from the tests.

In box 210, the failure mode with the highest percentage of instances of the corresponding defect pattern is defined as the "main failure mode" of the chip. The "main failure mode" contributes more to the yield loss than the other failure modes related to the hard failure procedure test. Assume there are i defect patterns that correspond to i failure modes on a wafer. Assume $C_i$ is the number of instances of the ith defect pattern in a chip, and $S_i$ is the total number of instances of the ith defect pattern that occurred on the wafer. The "main failure mode" for each chip corresponds to the defect pattern with the highest $C_i/S_i$ ratio. As an example, suppose the "single-bit defect pattern" is the first defect pattern, and it occurred only on chips #1, #2, and #3. Assume there were 3 instances of that defect pattern on chip #1, 5 instances on chip #2, and 8 instances on chip #3, then for chip #1, $C_1/S_1$ equals $3/(3+5+8)=3/16$; for chip #3, $C_1/S_1$ equals $8/(3+5+8)=1/2$, etc.

The reason for using the "percentage of instances" for comparison is because the maximum number of instances is different for each defect pattern. In the example given above, with a chip of 1024 regions, the maximum number of instances of "single-bit defect pattern" is 1024, while the maximum number of instances of the "twin-bit defect pattern" is 512, and the maximum number of instances of the "one-mega defect pattern" is 256. The ratio C/S more accurately reflects the effect, or contribution, of a defect pattern in a particular chip. Thus, adjusting the equipment or process related to the failure mode with the largest C/S ratio would improve yield rate most effectively.

In box 212, the yield loss contribution $Y_{main}$ for each of the "main failure mode" in a wafer is calculated from the following equation:

$$Y_{main} = Y \times f/F \quad \text{(Equ. 2)}$$

where f is the number of chips having that "main failure mode", and F is the total number of defective chips (a chip having any failure mode is deemed a defective chip). Y is the yield loss of the wafer under the hard failure procedure test, and is the ratio of the defective chips over the total number of chips. A chip is defective if any of the cells within the chip fails the hard failure procedure test. From $Y_{main}$, a user can determine the seriousness of the "main failure mode" in relation to the yield loss. By calculating the $Y_{main}$ value over a period of time, a user can determine whether adjustments to the equipment or processes have improved the yield rate, thereby more accurately pinpointing the cause of the defects.

Suppose some chips of the wafer have the "single-bit failure mode" as the main failure mode, some chips have "twin-bit failure mode" as the main failure mode, and some chips have "one-mega failure mode" as the main failure mode, then the yield loss contribution for each of the three failure modes are calculated to determine which has a greater effect on yield loss. The failure modes described above are for purpose of illustration only. For different applications and different processing steps, the number and types of failure modes will vary accordingly.

Shown in FIG. 3 is another embodiment of the invention. In box 302, a plurality of wafers are processed to form a plurality of chips thereon. In box 304, a plurality of electrical tests are performed the chips. In box 306, the failure modes for each chip are identified. In box 308, the yield loss contribution for each failure mode is calculated. The yield loss contribution can be calculated either according to Equ. 1 or Equ. 2. In box 310, the tasks for adjusting processes and equipment are prioritized according to the yield loss contribution of corresponding failure modes. Each failure mode corresponds to a task for adjusting processes and equipment. By ranking the failure modes according to the yield loss contribution, the most urgent task for improving the wafer manufacturing process can be obtained.

While the embodiment of the invention has been illustrated and described, it will be appreciated that various changes can be made therein without departing from the spirit and scope of the invention.

We claim:

1. A method of finding the yield loss contribution of a failure mode for improving yield rate in a semiconductor manufacturing process, comprising:
   providing a predetermined number of wafers, each wafer including a plurality of chips, each chip including a plurality of regions, and each region including a plurality of cells;
   performing a plurality of tests on said plurality of cells, each test corresponding to a failure mode;
   assigning a region as having a particular failure mode if any cell within said region has said particular failure mode;
   for each wafer, calculating the number of defective regions for each of said plurality of failure modes;
   for each wafer, determining a main failure mode that corresponds to the greatest number of defective regions;
   calculating a yield loss for each wafer;
   for each failure mode, selecting a set of wafers having said failure mode as the main failure mode, calculating the sum of the yield loss of said set of wafers, and determining the yield loss contribution of said each failure mode by dividing the sum of the yield loss by said predetermined number.

2. The method of claim 1, wherein said plurality of tests are electrical tests that measure electrical characteristics of said cells.

3. The method of claim 2, wherein said electrical tests are soft-failure tests.

4. The method of claim 1, wherein said plurality of tests comprises a first set of tests and a second set of tests, wherein said first set of tests determine whether a first set of parameters of a cell continuously meet a first set of criterion for a first predetermined period of time, and said second set of tests determine whether a second set of parameters of a cell continuously meet a second set of criterion for a second predetermined period of time.

5. The method of claim 1, wherein the step of calculating the yield loss of each of said plurality of wafers includes the step of calculating the number of defective chips in each wafer that failed any of said plurality of tests, and dividing said number of defective chips by the total number of chips in said each wafer.

6. A method of calculating yield loss contribution of a failure mode on a semiconductor wafer having a plurality of chips, each chip having a plurality of cells, comprising:
   providing the semiconductor wafer;
   dividing each chip on the wafer into a plurality of regions, each region including a plurality of cells;
   providing a set of reference defect patterns, each defect pattern corresponding to a failure mode;
   for each region within each chip, performing a test on the plurality of cells within said each region;
   marking a region as defective if any cell within said region fails said test;
   for each chip, finding failure modes in said each chip by comparing the pattern of defective regions of said each chip with said set of reference defect patterns;
   calculating a yield loss of said wafer;
   finding a main failure mode for each chip; and
   calculating the yield loss contribution of each failure mode by multiplying said yield loss of said wafer by f/F, wherein f represents the number of chips with said each failure mode as the main failure mode, and F represents the total number of defective chips in said wafer.

7. The method of claim 6, wherein each of said set of reference defect patterns corresponds to a distinct failure mode, and a chip has a failure mode when a pattern of defect regions in the chip matches the corresponding reference defect pattern for the failure mode.

8. The method of claim 6, wherein one of said reference defect pattern is a defect pattern in which a defective region is surrounded by functional regions.

9. The method of claim 6, wherein one of said reference defect pattern is a defect pattern in which two adjacent defective regions are surrounded by functional regions.

10. The method of claim 6, wherein the step of finding the main failure mode of a chip includes the step of:
   finding the C/S ratio for each failure mode, wherein C represents the number of instances that the corresponding defect pattern occurred in the chip, S represents the total number of instances that the defect pattern occurred in the wafer;
   designating the failure mode with the largest corresponding C/S ratio as the main failure mode.

11. The method of claim 6, wherein the yield loss of a wafer is calculated by dividing the number of defective chips by the total number of chips in the wafer, wherein a defective chip is a chip with at least one cell that failed said test.

12. The method of claim 6, wherein said test is a hard-failure test.

13. A method of prioritizing tasks for improving yield rate in a semiconductor manufacturing process, comprising the steps of:

providing a predetermined number of wafers;

processing said predetermined number of wafers to form a plurality of devices on each wafer, each device including a plurality of regions, and each region including a plurality of cells;

performing a first test and a second test on the cells in said plurality of regions;

calculating the yield loss of each of said plurality of wafers;

selecting a first set of wafers that has more regions with at least one cell failing said first test than the number of regions with at least one cell failing said second test;

selecting a second set of wafers that has more regions with at least one cell failing said second test than the number of regions with at least one cell failing said first test;

calculating a first yield loss contribution value by dividing the sum of the yield loss of said first set of wafers by said predetermined number;

calculating a second yield loss contribution value by dividing the sum of the yield loss of said second set of wafers by the said predetermined number;

ranking a first task for reducing cells that fail said first test as having a higher priority than a second task for reducing cells that fail said second test if said first yield loss contribution value is greater than said second yield loss contribution value; and ranking said second task for reducing cells that fail said second test as having a higher priority than said first task for reducing cells that fail said first test if said second yield loss contribution value is greater than said first yield loss contribution value.

14. The method of claim 13, wherein said first test and said second test are electrical tests that measure electrical characteristics of said cells.

15. The method of claim 14, wherein said first test determines whether a first parameter of a cell continuously meets a first criterion for a predetermined period of time, and said second test determines whether a second parameter of a cell continuously meets a second criterion for said predetermined period of time.

16. The method of claim 13, wherein the step of calculating the yield loss of each of said plurality of wafers includes the step of calculating the number of defective devices in each wafer that failed either said first test or said second test, and dividing said number of defective devices by the total number of devices in said each wafer.

17. The method of claim 13, wherein each of said plurality of devices is a memory device having a plurality of memory cells.

18. A method of prioritizing failure modes for improving yield rate in a semiconductor manufacturing process, comprising the steps of:

providing a predetermined number of wafers;

processing said predetermined number of wafers to form a plurality of memory devices on each wafer, each memory device including a plurality of regions, and each region including a plurality of memory cells;

performing a predetermined number of soft fail tests on the memory cells in said plurality of regions in each wafer, said predetermined number of tests including a first soft fail test and a second soft fail test, said first soft fail test corresponding to a first failure mode, and said second soft fail test corresponding to a second failure mode;

calculating the yield loss of each of said plurality of wafers;

selecting a first set of wafers having said first failure mode as the main failure mode;

selecting a second set of wafers having said second failure mode as the main failure mode;

calculating a first yield loss contribution value by dividing the sum of the yield loss of said first set of wafers by said predetermined number;

calculating a second yield loss contribution value by dividing the sum of the yield loss of said second set of wafers by the said predetermined number;

ranking said first failure mode as having a higher priority than said second failure mode if said first yield loss contribution value is greater than said second yield loss contribution value; and ranking said second failure mode as having a higher priority than said first failure mode if said second yield loss contribution value is greater than said first yield loss contribution value.

19. A method of prioritizing failure modes for improving yield rate in a semiconductor manufacturing process, comprising the steps of:

providing a predetermined number of wafers;

processing said predetermined number of wafers to form a plurality of devices on each of said predetermined number of wafers, each device having a plurality of cells;

dividing each of said device into a plurality of regions, each region including more than one cell;

for each wafer, performing a predetermined number of tests on each of said region to find a first set of regions having at least one cell with a first failure mode and a second set of regions having at least one cell with a second failure mode;

calculating the yield loss of each of said plurality of wafers;

selecting a first set of wafers such that the number of said first set of regions within a wafer is greater than the number of said second set of regions;

selecting a second set of wafers such that the number of said second set of regions within a wafer is greater than the number of said first set of regions;

calculating a first yield loss contribution value by dividing the sum of the yield loss of said first set of wafers by said predetermined number;

calculating a second yield loss contribution value by diving the sum of the yield loss of said second set of wafers by the said predetermined number;

ranking a first failure mode as having a higher priority than said second failure mode if said first yield loss contribution value is greater than said second yield loss contribution value; and ranking said second failure mode as having a higher priority than said first failure mode if said second yield loss contribution value is greater than said first yield loss contribution value.

20. The method of claim 19, wherein said cell has a first failure mode when said cell fails a first subset of said predetermined number of tests, and said cell has a second failure mode when said cell fails a second subset of said predetermined number of tests.

21. The method of claim 19, wherein each of said predetermined number of tests determines whether a parameter of a cell continuously meets a criterion for a predetermined period of time.

22. The method of claim 19, wherein the yield loss of a wafer is calculated by dividing the number of defective devices by the total number of devices in said wafer, wherein a defective device is a device having at least one cell failing one of said predetermined number of tests.

23. The method of claim 19, wherein each of said plurality of devices is a memory device having a plurality of memory cells.

24. A method of finding the yield loss contribution of a failure mode in a semiconductor wafer, comprising the steps of:

providing a predetermined number of wafers, each wafer including a plurality of memory chips, each chip including a plurality of regions, and each region including a plurality of memory cells;

performing a plurality of soft fail tests on said plurality of said memory cells, each of said plurality of soft fail tests corresponding to a failure mode;

assigning a region as having a failure mode if any memory cell within said region fails the corresponding soft fail test for said failure mode;

calculating the number of defective regions that is assigned to a particular failure mode for each of said plurality of failure modes and for each wafer;

determining a main failure mode for each wafer, said main failure being a failure mode that has the greatest number of regions assigned to said failure mode;

calculating a yield loss for each wafer;

selecting a set of wafers having a particular failure mode as the main failure mode;

calculating the sum of the yield loss of said set of wafers; and calculating a yield loss contribution value of said particular failure mode by dividing the sum of said yield loss of said set of wafers by said predetermined number.

25. A method of calculating yield loss contribution of a failure mode on a semiconductor wafer having a plurality of memory chips, each chip having a plurality of memory cells, comprising the steps of:

providing the semiconductor wafer having the plurality of memory chips;

dividing each memory chip on the wafer into a plurality of regions, each region including a plurality of memory cells;

providing a set of reference defect patterns, each defect pattern corresponding to a failure mode;

performing a hard fail test on the plurality of memory cells within each region for each memory chip;

marking a region as defective if any memory cell within said region fails said hard fail test;

finding failure modes in each memory chip by comparing the pattern of defective regions of said each memory chip with said set of reference defect patterns;

calculating a yield loss of said wafer;

finding a main failure mode for each chip; and calculating the yield loss contribution of a failure mode by multiplying said yield loss of said wafer by f/F, wherein f represents the number of chips with said failure mode as the main failure mode, and F represents the total number of defective chips in said wafer.

* * * * *